United States Patent [19]

Cook et al.

[11] 4,344,185
[45] Aug. 10, 1982

[54] LOW NOISE HIGH STABILITY FM TRANSMITTER

[75] Inventors: Carroll J. Cook, Plano; Timothy K. Henthorn, Allen, both of Tex.

[73] Assignee: Rockwell International Corporation, El Segundo, Calif.

[21] Appl. No.: 172,737

[22] Filed: Jul. 28, 1980

[51] Int. Cl.³ .......................... H04B 1/04; H03C 3/02
[52] U.S. Cl. .................................. 455/110; 455/113; 455/126; 332/23 A
[58] Field of Search ............... 455/110, 111, 112, 113, 455/119, 126, 102, 103; 332/22, 23 R, 23 A; 329/122, 124, 50, 112, 114

[56] References Cited

U.S. PATENT DOCUMENTS

| | | | |
|---|---|---|---|
| 3,222,459 | 12/1965 | Drapkin | 455/110 |
| 3,320,552 | 5/1967 | Glasser | 455/110 |
| 3,514,719 | 5/1970 | Rhodes | 332/23 |
| 3,996,532 | 12/1976 | Fletcher | 332/23 R |
| 4,092,606 | 5/1978 | Ryan | 329/124 |

Primary Examiner—Tommy P. Chin
Attorney, Agent, or Firm—V. Lawrence Sewell; Howard R. Greenberg; H. Fredrick Hamann

[57] ABSTRACT

An FM transmitter is disclosed wherein a solid state microwave source at a first frequency is frequency modulated with a baseband signal, and a second such source at a different frequency is frequency modulated with the baseband signal inverted. Each of the modulated carriers is frequency doubled and input to a mixer. The output of the mixer is a carrier, having a frequency which is twice the difference of the two microwave frequencies, and frequency modulated by the baseband signal. An automatic frequency control circuit inputs equal and opposite control voltages to the two microwave sources.

3 Claims, 1 Drawing Figure

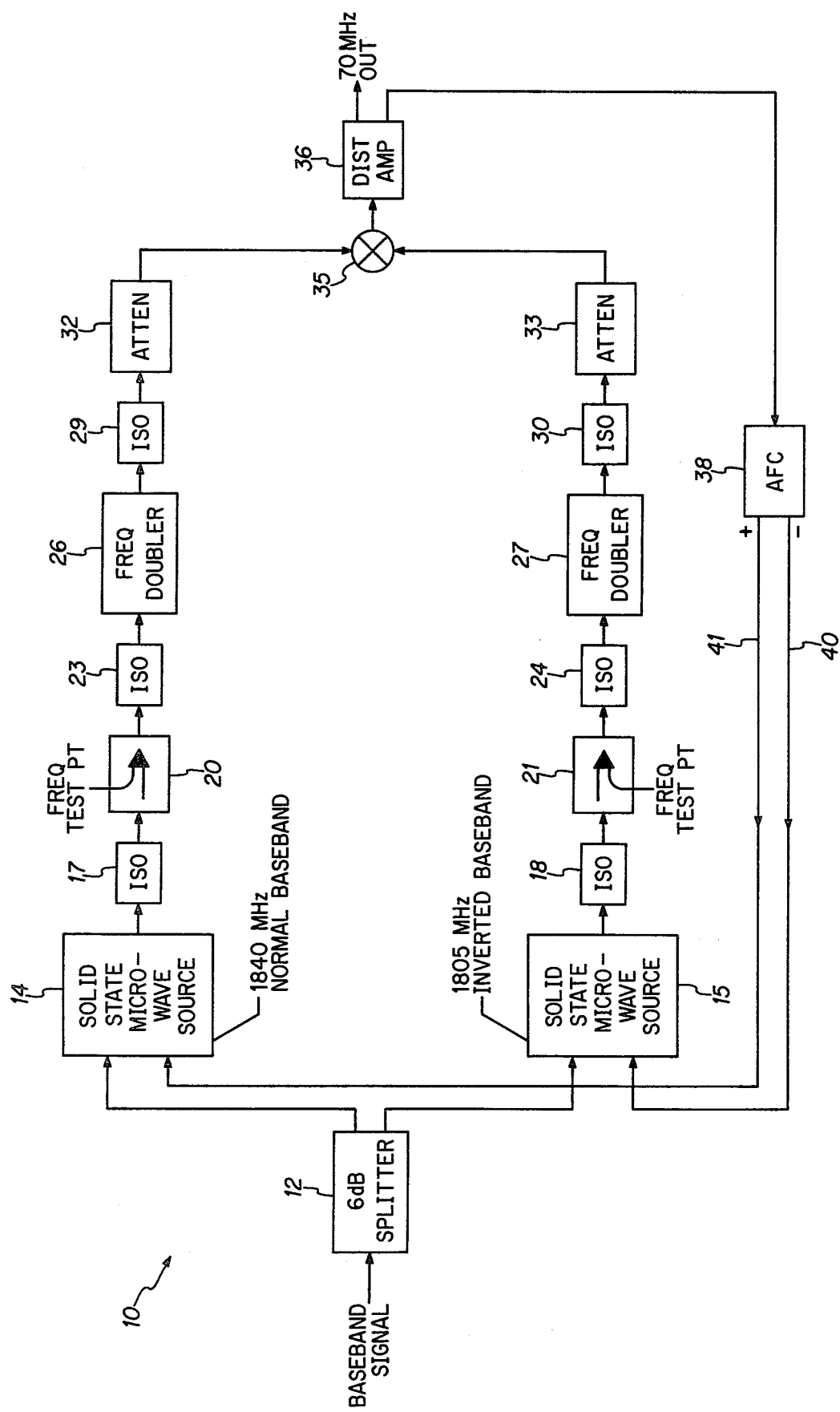

LOW NOISE HIGH STABILITY FM TRANSMITTER

BACKGROUND OF THE INVENTION

This invention relates to a low noise, high stability FM transmitter suitable for use in communication or as a test instrument.

One type of prior art FM transmitter has utilized a pair of varacter diode frequency sources each operating at a different carrier frequency, for example, 595 MHz and 525 MHz. One source is frequency modulated with the baseband signal, while the other is frequency modulated with the baseband signal inverted. The two modulated carriers are mixed to provide a difference frequency, in this case, a 70 MHz output. The present inventors were not satisfied with the operating characteristics of this type of transmitter, particularly the noise level. They have conceived an improvement which provides better noise characteristics and frequency stability, as well as good linerity.

SUMMARY OF THE INVENTION

In accordance with the present invention, there is provided an FM transmitter wherein a pair of microwave oscillators are used as sources. One of the oscillators is used to generate a carrier at a first frequency, frequency modulated with a baseband signal, while the other is used to generate a carrier at a second frequency, frequency modulated with the baseband signal inverted. Each of the modulated carriers is frequency doubled; then the two doubled modulated carriers are mixed. The output of the mixing is a carrier at a third frequency, equal to twice the difference of the first and second frequencies, frequency modulated by the baseband signal.

BRIEF DESCRIPTION OF THE DRAWING

The sole FIGURE is a block diagram of an FM transmitter according to the invention.

DESCRIPTION OF A PREFERRED EMBODIMENT

The FIGURE shows a block diagram of an FM transmitter according to the invention indicated generally by the reference numeral 10. The transmitter will be described with respect to particular microwave oscillator frequencies, but it will be understood by those skilled in the art that other frequencies may be employed.

The baseband or modulating signal is delivered by splitter 12 to two solid state microwave sources 14 and 15. Oscillators which have been used in an actual reduction to practice are transmit oscillators from the Rockwell Collins MAR-6 radio, with oscillator 14 operating at 1840 MHz and oscillator 15 operating at 1805 MHz. Oscillator 14 is frequency modulated by the baseband signal, while oscillator 15 is frequency modulated with the baseband signal inverted.

The output of each microwave source is connected to a two GHz load isolator. The load isolators 17 and 18, as well as others in the system are commercially available items. The output of isolators 17 and 18 are connected to frequency test points 20 and 21 respectively. The frequency test points are 10 db directional couplers which are commercially available.

The outputs of the frequency test points or directional couplers are connected through load isolators 23 and 24 to frequency doublers 26 and 27. The frequency doublers are of the kind found in the Rockwell Collins MAR-6 radio and include a step recovery diode which creates harmonics that are filtered by a resonant cavity to produce the frequency doubled output. The outputs of frequency doublers 26 and 27 are coupled through load isolators 29 and 30 respectively to variable attenuators 32 and 33 respectively. The attenuators are used to provide a final output from the transmitter 10 which is of a desired power level.

The outputs of the two attenuators 32 and 33 form inputs to a mixer 35. The mixer, a Vari-L DBM-601, is a 4 diode bridge mixer. The input to mixer 35 from attenuator 32 has a carrier frequency of 3680 MHz, while the input from attenuator 33 has a carrier frequency of 3620 MHz. Accordingly, the output of the mixer has a 70 MHz carrier frequency. This output is frequency modulated by the baseband signal.

The 70 MHz output from mixer 35 is delivered to a distribution amplifier 36 having two outputs. One output of the amplifier forms the output of the transmitter, while the other output goes to an automatic frequency control circuit 38. The circuit 38 is a 70 MHz countdown automatic frequency control with equal and opposite output control voltages 40 and 41. One of the voltages 40 controls source 15, while the other voltage 41 controls source 14.

The inventors of the present invention recognized that a solid state microwave source can have much lower noise than a varactor diode oscillator. In addition, the basic frequency of the microwave oscillator can be made more stable by the use of a resonant cavity structure. Also, sought after was good linearity.

The linearity in the transmitter of the present invention is improved because the frequency modulation is of a much smaller percentage of the carrier frequency than in the case of the varactor diode source. Thus, for example, 1805 MHz is modulated as opposed to 525 MHz. The difference in the percentage of modulation is enhanced by the use of frequency doubling. That is, the frequency deviation of the modulation at one of the sources 14 or 15 is half the deviation which is exhibited at the output of the transmitter, because of the action of frequency doublers 26 and 17.

The inventors found that, unexpectedly, the use of the frequency doublers did not adversely affect either the stability of the output carrier frequency or the noise performance.

Thus, the use of a low noise microwave source, modulated over a smaller percentage of its basic frequency than prior art sources, along with frequency doubling and automatic frequency control, provides an FM transmitter with improved noise characteristics, frequency stability and good linearity.

We claim:
1. An FM transmitter comprising:
   means, including a microwave oscillator, for generating a carrier, at a first frequency, frequency modulated with a baseband signal;
   means, including a microwave oscillator, for generating a carrier, at a second frequency, frequency modulated with said baseband signal inverted;
   means for multiplying the frequency of the modulated carrier of said first frequency by a constant factor;

means for multiplying the frequency of the modulated carrier of said second frequency by said factor;

a mixer receiving each of said frequency multiplied modulated carriers, whereby the output of said mixer is a carrier, at a third frequency equal to said factor multiplied by the difference of said first and second frequencies, frequency modulated by said baseband signal.

2. The transmitter of claim 1, wherein each of said microwave oscillators is a solid state microwave source.

3. The transmitter of claim 1, further including an automatic frequency control circuit responsive to the output of said mixer and having equal and opposite output control voltages, each of said control voltages controlling a different one of said means for generating.

* * * * *